United States Patent
Chen et al.

(10) Patent No.: US 9,618,921 B2
(45) Date of Patent: Apr. 11, 2017

(54) OBJECT CARRIER TRANSPORT SYSTEM AND METHOD OF TRANSPORTING OBJECT CARRIERS

(71) Applicant: INOTERA MEMORIES, INC., Taoyuan County (TW)

(72) Inventors: Tsan I Chen, Taoyuan County (TW); Yu-Kun Chen, New Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 423 days.

(21) Appl. No.: 14/249,469

(22) Filed: Apr. 10, 2014

(65) Prior Publication Data

US 2015/0198942 A1 Jul. 16, 2015

(30) Foreign Application Priority Data

Jan. 10, 2014 (TW) .............................. 103100994 A

(51) Int. Cl.
*G05B 19/04* (2006.01)
*G05B 19/418* (2006.01)
*H01L 21/00* (2006.01)

(52) U.S. Cl.
CPC ... *G05B 19/0405* (2013.01); *G05B 19/41865* (2013.01); *H01L 21/00* (2013.01); *G05B 2219/2602* (2013.01); *G05B 2219/32266* (2013.01); *G05B 2219/45031* (2013.01); *Y02P 90/20* (2015.11)

(58) Field of Classification Search
None
See application file for complete search history.

(56) References Cited

U.S. PATENT DOCUMENTS

| | | | | |
|---|---|---|---|---|
| 5,024,570 A | * | 6/1991 | Kiriseko | H01L 21/67173 414/222.06 |
| 5,291,001 A | * | 3/1994 | Krayer | G06K 17/0012 235/375 |
| 5,399,531 A | * | 3/1995 | Wu | H01L 21/67017 29/25.01 |
| 5,548,521 A | * | 8/1996 | Krayer | G06K 17/0012 235/375 |
| 5,955,857 A | | 9/1999 | Kwon et al. | |

(Continued)

FOREIGN PATENT DOCUMENTS

| TW | 200805552 A | 1/2008 |
|---|---|---|
| TW | 200810002 A | 2/2008 |

*Primary Examiner* — Van Nguyen
(74) *Attorney, Agent, or Firm* — Rosenberg, Klein & Lee

(57) ABSTRACT

A semiconductor electronic device structure includes an active area array disposed in a substrate, an isolation structure, a plurality of recessed gate structures, a plurality of word lines, and a plurality of bit lines. The active area array a plurality of active area columns and a plurality of active area rows, defining an array of active areas. The substrate has two recesses formed at the central region thereof. Each recessed gate structure is respectively disposed in the recess. A protruding structure is formed on the substrate in each recess. A STI structure of the isolation structure is arranged between each pair of adjacent active area rows. Word lines are disposed in the substrate, each electrically connecting the gate structures there-under. Bit lines are disposed above the active areas, forming a crossing pattern with the word lines.

6 Claims, 9 Drawing Sheets

(56) References Cited

U.S. PATENT DOCUMENTS

| | | | | |
|---|---|---|---|---|
| 6,877,944 B2* | 4/2005 | Peiter | H01L 21/67724 198/465.2 |
| 7,039,495 B1* | 5/2006 | Conboy | G05B 19/41865 700/213 |
| 7,177,716 B2* | 2/2007 | Duffin | G05B 19/4189 414/222.01 |
| 7,522,969 B2* | 4/2009 | Duffin | G05B 19/4189 414/222.01 |
| 7,567,851 B2* | 7/2009 | Schmidt | G05B 19/41865 700/103 |
| 7,571,020 B2* | 8/2009 | Schmidt | G05B 19/41865 700/101 |
| 7,603,196 B2* | 10/2009 | Duffin | G05B 19/4189 414/222.01 |
| 8,219,233 B2* | 7/2012 | Tsukinoki | H01L 21/67276 414/940 |
| 8,482,069 B2* | 7/2013 | Yamazaki | H01L 21/28273 257/347 |
| 8,868,233 B2* | 10/2014 | Shibata | G05B 19/41865 700/213 |
| 9,176,496 B2* | 11/2015 | Shibata | G05B 19/41825 |
| 2005/0273190 A1* | 12/2005 | Duffin | G05B 19/4189 700/112 |
| 2006/0095153 A1* | 5/2006 | Chang | G05B 19/4189 700/121 |
| 2007/0282477 A1* | 12/2007 | Schmidt | G05B 19/41865 700/101 |
| 2008/0156618 A1* | 7/2008 | Brain | B65G 37/005 198/349.6 |
| 2010/0074717 A1* | 3/2010 | Huang | H01L 21/67733 414/222.02 |
| 2010/0204821 A1* | 8/2010 | Tsukinoki | H01L 21/67276 700/218 |
| 2015/0162180 A1* | 6/2015 | Grau | H01L 21/02 700/121 |

* cited by examiner

OBJECT CARRIER TRANSPORT SYSTEM AND METHOD OF TRANSPORTING OBJECT CARRIERS

BACKGROUND

1. Field of the Invention

The instant disclosure relates to a object carrier transport system and a method of transporting object carriers, and pertains particularly to a object carrier transport system and a method of transporting object carriers adapted to a carrier storage apparatus.

2. Description of Related Art

During a manufacturing process of a semiconductor with high-density integrated circuit, hundreds of steps are carried out. Wafers on the same batch need to be transported from one of a plurality processing machines to another to finish all the steps required.

A plurality of semiconductor wafers can be housed in a front opening unified pod (FOUP), and a plurality of FOUPs may be carried around in various rooms or between various processing machines in response to the processing stage of the semiconductor wafers in each of the FOUPs. In addition, after the completion of the instant stage of the process, the FOUPs with the semiconductor wafers may be moved into a storage apparatus due to the production capacity or other reasons.

When the wafers housed in the FOUPs need to continue a commanded processing stage, it is important to efficiently transport and allocate the FOUPs to the appropriate process area or process machine.

SUMMARY OF THE INVENTION

The embodiment of the instant disclosure provides a object carrier transport system and a method of transporting object carriers. When the carrier storage apparatus is in the idle status, the object carrier transport system is for arranging the carriers in a plurality of storage sections according to the relative priorities of the carriers and the relative priorities of the storage sections.

The object carrier transport system in accordance with the instant disclosure is adapted to a carrier storage apparatus for carrying carriers in a plurality of storage sections. The carriers each have a relative priority denoted by a first positive integer, and the storage sections each have a relative priority denoted by a second positive integer. The object carrier transport system comprises a handling unit, a control unit coupled to the handling unit, and a processing unit coupled to the control unit. The handling unit is for moving the carriers. The control unit is for controlling the handling unit to move the carriers stored in the storage sections when the carrier storage apparatus is idle. The processing is for regularly updating the relative priorities of the carriers. The control unit is for controlling the handling unit to move the carriers of the relative priority N in the storage section of the relative priority M to another of the storage sections, in which N and M are positive integer and N is not equal to M.

Another aspect of the instant disclosure provides a method of transporting object carriers. The method of transporting object carriers is adapted to a carrier storage apparatus configured to execute storage and retrieval commands for carrying carriers in a plurality of storage sections. The carriers each have a relative priority denoted by a first positive integer, and the storage sections each have a relative priority denoted by a second positive integer. The method of transporting object carriers comprises the following steps: first, checking if the carrier storage apparatus has completed the storage and retrieval commands and enters an idle status; updating the relative priorities of the carriers in the storage sections; moving the carrier of the relative priority N in the storage section of the relative priority M to another of the storage sections when the carrier storage apparatus is in the idle status, in which N and M are positive integers and N is not equal to M.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The novel features believed characteristic of the invention are set forth in the appended claims. the invention itself, however, as well as a preferred mode of use, further objectives and advantages thereof, will best be understood by reference to the following detailed description of an illustrative embodiments when read in conjunction with the accompanying drawings, wherein:

FIG. 3-1 and FIG. 3-2 illustrate a flowchart of a method of transporting object carriers in accordance with an embodiment the instant disclosure.

DETAILED DESCRIPTION OF THE PREFERRED EMBODIMENTS

The instant disclosure will be described more specifically with reference to the following embodiments. It is to be noted that the following descriptions of preferred embodiments are provided herein for purpose of illustration and description. It is not intended to be exhaustive or limiting to the precise form disclosed.

The First Embodiment of the Instant Disclosure

Figure 1:
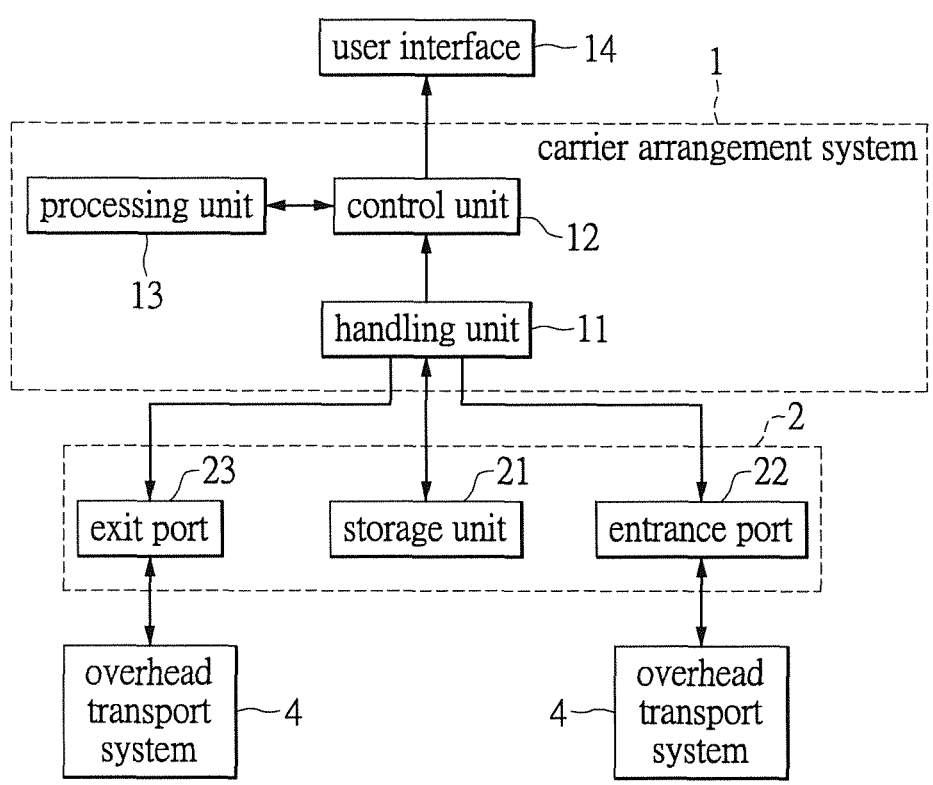
FIG. 1 illustrates a function block diagram of a object carrier transport system in accordance with an embodiment the instant disclosure.

Please refer to FIG. 1. FIG. 1 illustrates a function block diagram of a object carrier transport system in accordance with an embodiment the instant disclosure. The object carrier transport system 1 is adapted to a carrier storage apparatus 2, wherein the carrier storage apparatus 2 is configured to execute storage and retrieval commands for carrying carriers 3 (as shown in FIGS. 2A to 2D) into or out of a storage unit 21, which includes a plurality of storage sections 211, 212, and 213 (as shown in FIGS. 2A to 2D). The object carrier transport system 1 includes a handling unit 11, a control unit 12 coupling to the handling unit 11, and a processing unit 13 coupling to the control unit 12.

Please refer to FIG. 2A to FIG. 2D. FIG. 2A to FIG. 2D illustrate perspective views of carriers stored in a plurality of storage sections in accordance with the instant disclosure. In the exemplary disclosure, the carrier storage apparatus 2 can be a fixed buffer apparatus disposed in a wafer fabrication facility, and the carriers are front opening unified pods (FOUPs). The carrier storage apparatus 2 has at least one entrance port 22 and at least one exit port 23 (as shown in FIG. 1). The carriers 3 can be transported into the carrier storage apparatus 2 through the entrance port 22 or out of the carrier storage apparatus 2 through the exit port 23. In addition, the carriers 3 can be transported between other process tools in the wafer fabrication facility, and/or the entrance port 22 or the exit port 23 via an overhead transport system 4.

Figure 2A:
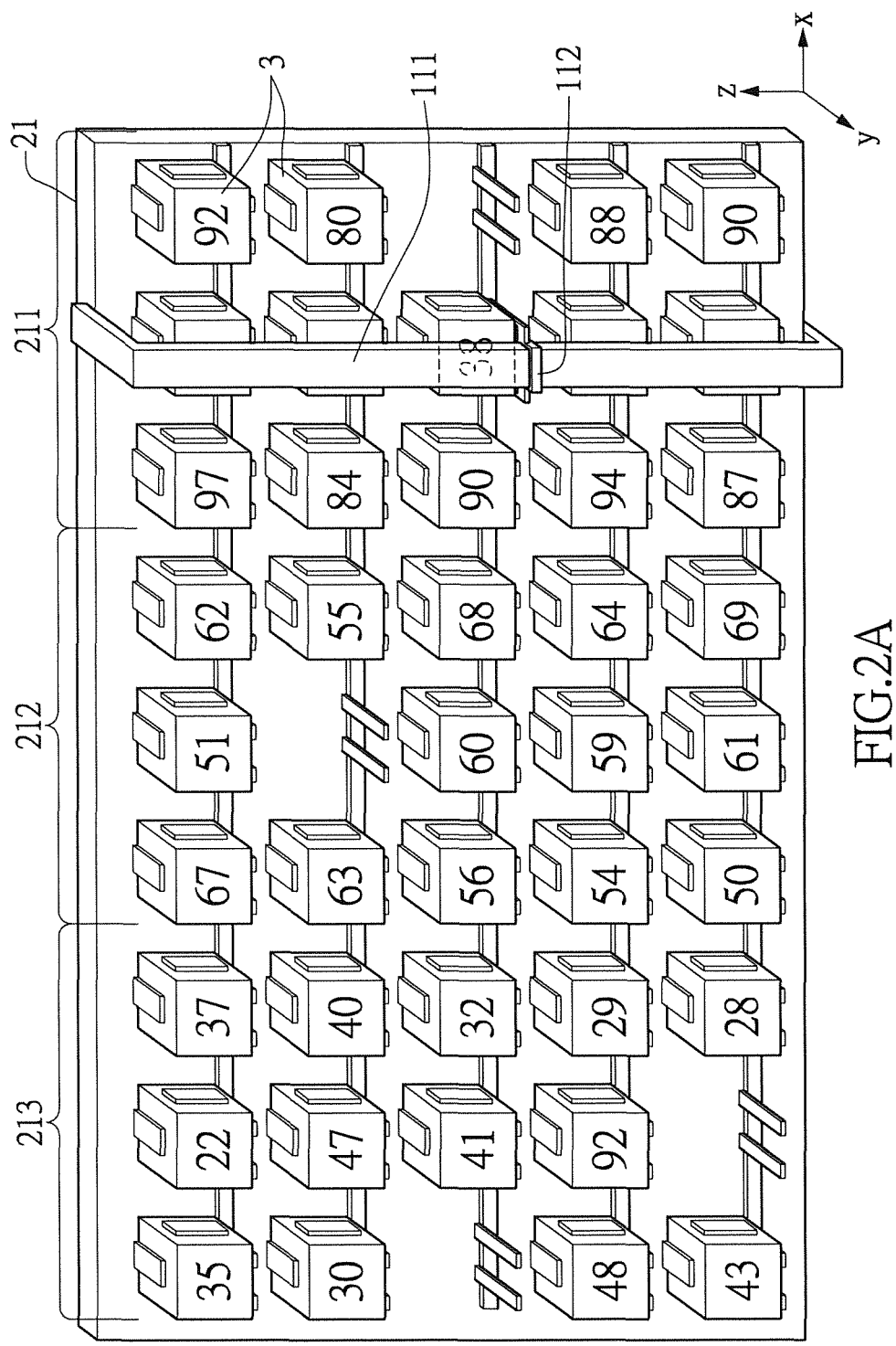
FIG. 2A to FIG. 2D illustrate perspective views of carriers stored in a plurality of storage sections in accordance with the instant disclosure.

As shown in FIG. 2A, the storage unit 21, for example, includes three of the storage sections such as a high storage section 211, a medium storage section 222, and a low storage section 213. The storage sections 211, 212, and 213 each have a plurality of storing rooms, and the carriers 3 each can be stored in one of the storing rooms.

The storage sections 211, 212, and 213 each have a relative priority. Specifically, the relative priority of the high storage section 211 is the highest. The relative priority of the low storage section 213 is the lowest. The relative priority of the medium storage section 212 is between that of the high storage section 211 and that of the low storage section 213. The relative priorities of the storage sections 211, 212, and 213 are determined according to the distances between each of the storage sections 211, 212, and 213 and the exit port 23. For example, the distance between the high storage section 211 and the exit port 23 is the shortest, and the distance between the low storage section 213 and the exit port 23 is the farthest. In addition, the carriers 3 each have a relative priority, which will be described in detail later.

The handling unit 11 can be a crane and includes a main arm 111 and a secondary arm 112, which both can move between two storing racks of the storage unit 21. The processing unit 13 is for updating the relative priorities of the carriers 3 stored in the storage unit 21 at regular time intervals.

Specifically, the processing unit 13 can update the relative priorities of each of the carriers 3 stored in the storage unit 21 according to a level of importance of the carrier 3, such as high level, medium level or low level, and to how long the carrier 3 has been stored in the storage unit 21. The level of importance of each of the carrier 3 is related to the characteristic of the silicon wafers held in the carrier 3, such as the process stage of the silicon wafers held in the carrier 3, whether the silicon wafers held in the carrier 3 are testing samples, which customer the silicon wafers held in the carrier 3 are supplied to, and whether the silicon wafers held in the carrier 3 are urgent.

Figure 5:
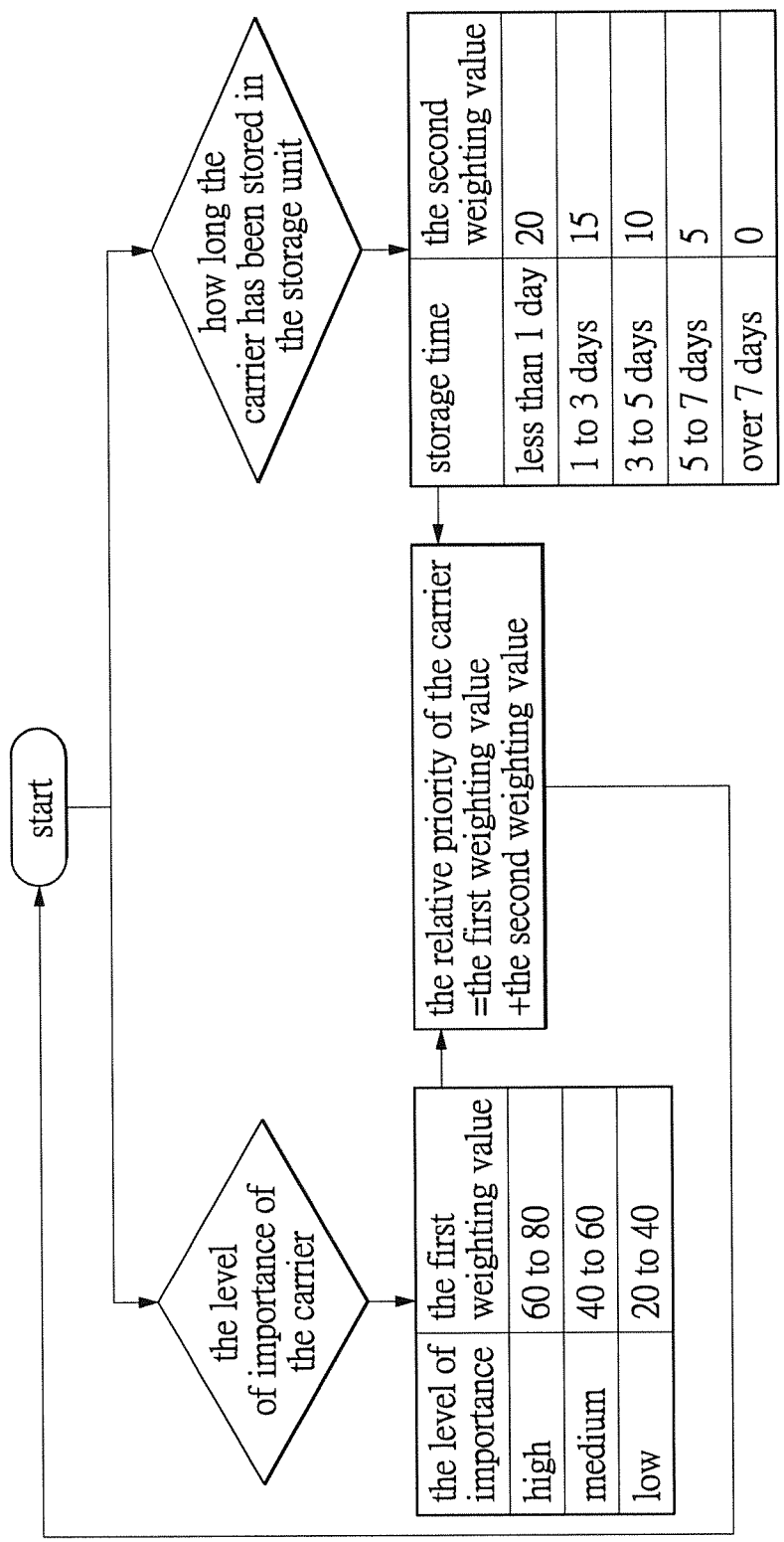
FIG. 5 illustrates a flowchart of a method of updating relative priorities of the carriers in accordance with an embodiment the instant disclosure.

Please refer to FIG. 5. FIG. 5 illustrates a flowchart of a method of updating relative priorities of the carriers in accordance with another embodiment the instant disclosure. The processing unit 13 can determine a first weighting value of each of the carriers 3 stored in the storage unit 21 according to the level of importance of the carrier 3, and determine a second weighting value of each of the carriers 3 stored in the storage unit 21 according to how long the carrier 3 has been stored in the storage unit 21. The first weighting value and the second weighting value are parameters for updating the relative priority of each of the carriers 3.

As shown in FIG. 5, for example, the first weighting value of the carrier 3 with low level of importance is determined as 20 to 40; the first weighting value of the carrier 3 with medium level of importance is determined as 40 to 60; and first weighting value of the carrier 3 with high level of importance is determined as 60 to 80. Moreover, the second weighting value of the carrier 3 which has been stored in the storage unit 21 for over 7 days is determined as 0; the second weighting value of the carrier 3 which has been stored in the storage unit 21 for 5 to 7 days is determined as 5; the second weighting value of the carrier 3 which has been stored in the storage unit 21 for 3 to 5 days is determined as 10; the second weighting value of the carrier 3 which has been stored in the storage unit 21 for 1 to 3 days is determined as 15; and the second weighting value of the carrier 3 which has been stored in the storage unit 21 for less than 1 day is determined as 20. In the instant embodiment, the processing unit 13 determines the relative priority of each of the carrier 3 according to the sum of the first weighting value and the second weighting value respectively.

Please refer again to FIG. 2A to FIG. 2D, in the instant embodiment, corresponding to the storage sections 211, 212, and 213 of the storage unit 21, the processing unit 13 determines the relative priority of each of the carrier 3 as high priority, medium priority, or low priority. In other words, the carrier 3 stored in the storage unit 21 each can be determined as a high carrier, a medium carrier, or a low medium, wherein the relative priority of the high carrier is the highest, the relative priority of the low carrier is the lowest, and the relative priority of the medium carrier is between that of the high carriers and that of the low carriers. For example, the sum of the first and the second weighting value of the high carrier is 80 to 100; the sum of the first and the second weighting value of the medium carrier is 50 to 79; and the sum of the first and the second weighting value of the low carrier is 20 to 49. the carriers 3 in the storage unit 21 as shown in FIG. 2A to FIG. 2D are each referenced by a number which is corresponding to the sum of the first and the second weighting value.

It is worth noting that, the processing unit 13 updates the first and the second weighting values of each of the carriers 3 in the storage unit 21 to update the relative priority of each of the carriers 3 at regular time intervals, such as every 5 minutes, according to the updated information the processing unit 13 obtained.

In addition, the processing unit 13 is also for determining the relative priorities of the storage sections 211, 212, and 213. In another exemplarily embodiment, the processing unit 13 is for dividing the storage unit 21 into the plurality of the storage sections, such as the storage sections 211, 212, and 213.

The control unit 12 is for controlling the handling unit 11 to move the carriers 3 stored in the storage sections 211, 212, and 213 when the carrier storage apparatus 2 is idle according to the relative priorities of the carriers 3 and relative priorities of the storage sections 211, 212, and 213.

The control unit 12 can be coupled to a user interface 14, which may include an input device (such as a keyboard), an output device (such as a printer), and a displaying device (such as a monitor with a screen for displaying information to the user). In an exemplarily embodiment, the levels of importance of the carriers 3 can be updated by the user, and the information related to the levels of importance of the carriers 3 can be input into the control unit 12 by the user through the user interface 14.

The following describes the operation of the object carrier transport system 1 and a method of transporting object carriers adapted to the carrier storage apparatus 2 of the present disclosure. Please refer concurrently to FIGS. 2A to 2D, FIG. 3-1, and FIG. 3-2. FIG. 3-1 and FIG. 3-1 illustrate a flowchart of a method of transporting object carriers in accordance with an embodiment the instant disclosure.

Please refer to step S100 in FIG. 3-1, firstly, the object carrier transport system 1 checks if there is any of the storage and retrieval commands has not been executed by the carrier storage apparatus 2. Not until the carrier storage apparatus 2 completes executing the storage and retrieval commands and enters an idle status, does the carrier storage apparatus 2 move the carriers 3 in the storage unit 21 for arranging the carriers 3. In other words, when the carrier storage apparatus 2 enters the idle status, no carrier 3 is carried into or out of the storage unit 21.

Please refer concurrently to FIG. 2A and step S101 in FIG. 3-1, next, the object carrier transport system 1 checks if the high storage section 211 has the low carriers 3 if the object carrier transport system 1 confirms that the carrier storage apparatus 2 has completed the storage and retrieval commands and enters the idle status.

Please refer to step S102 in FIG. 3-1, then, the object carrier transport system 1 checks if the low storage section 213 is full of the carriers 3 if the object carrier transport system 1 confirms that the high storage section 211 has the low carriers 3 (such as the carrier 3 referenced by number 38 in FIG. 2A). In other words, the object carrier transport system 1 checks if there is any unoccupied storing room in the low storage section 213.

Figure 2B:
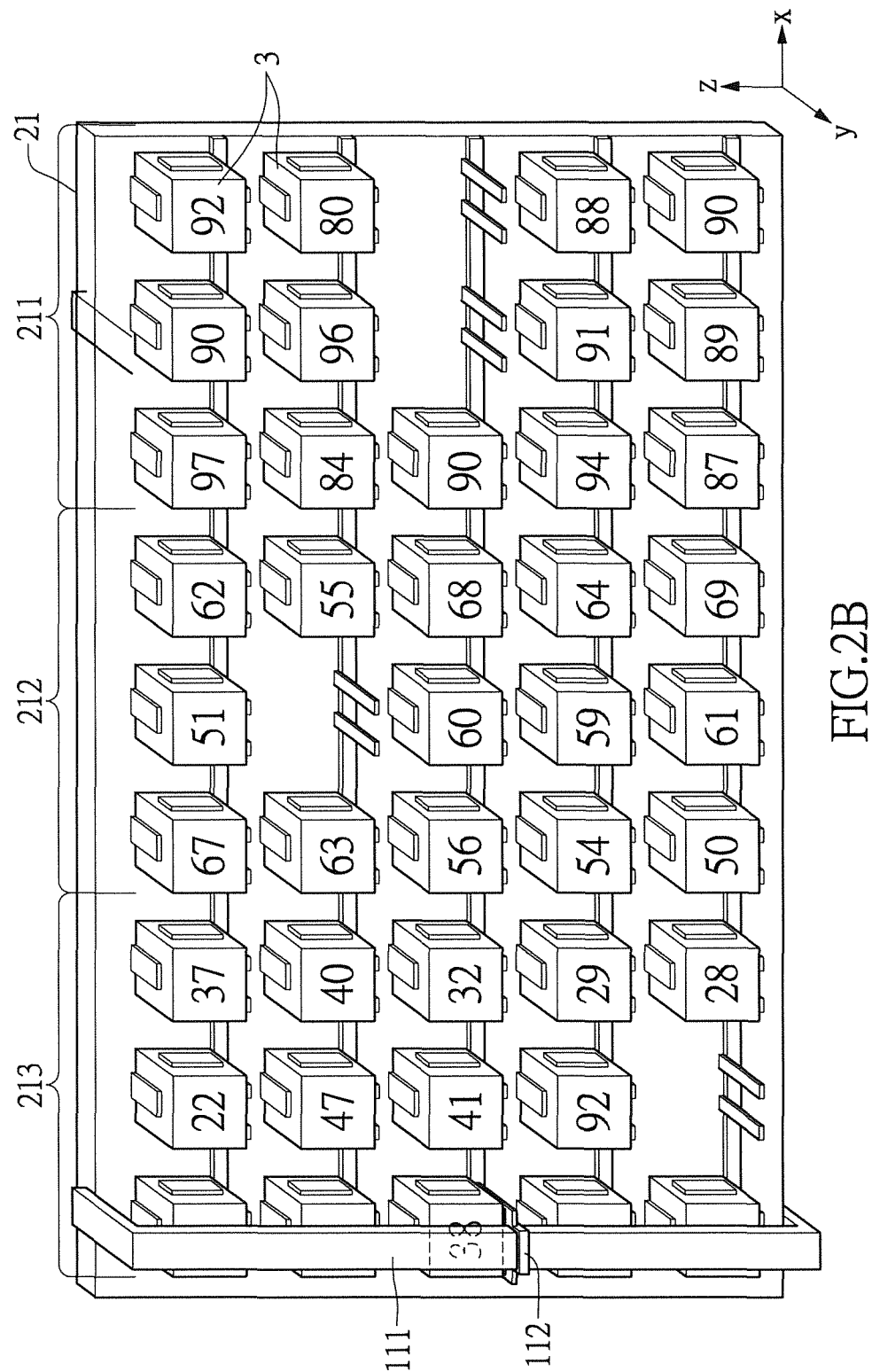
Figures 1, 3:
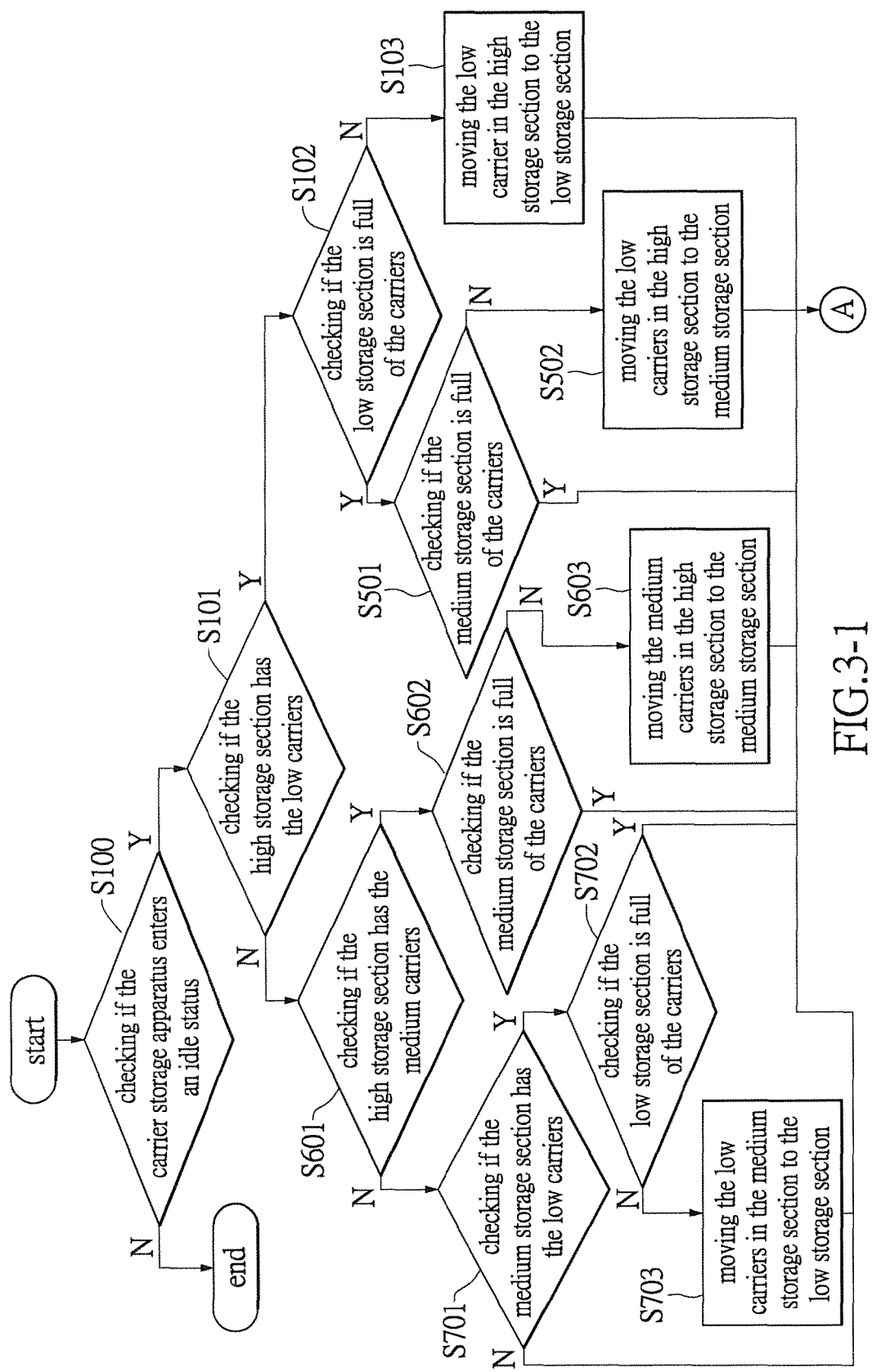

Please refer concurrently to FIGS. 2A to 2B and step S103 in FIG. 3-1, then, the object carrier transport system 1 moves the low carrier 3 in the high storage section 211 to the low storage section 213 if the object carrier transport system 1 confirms that the low storage section 213 is not full of the carriers 3.

Figure 2C:
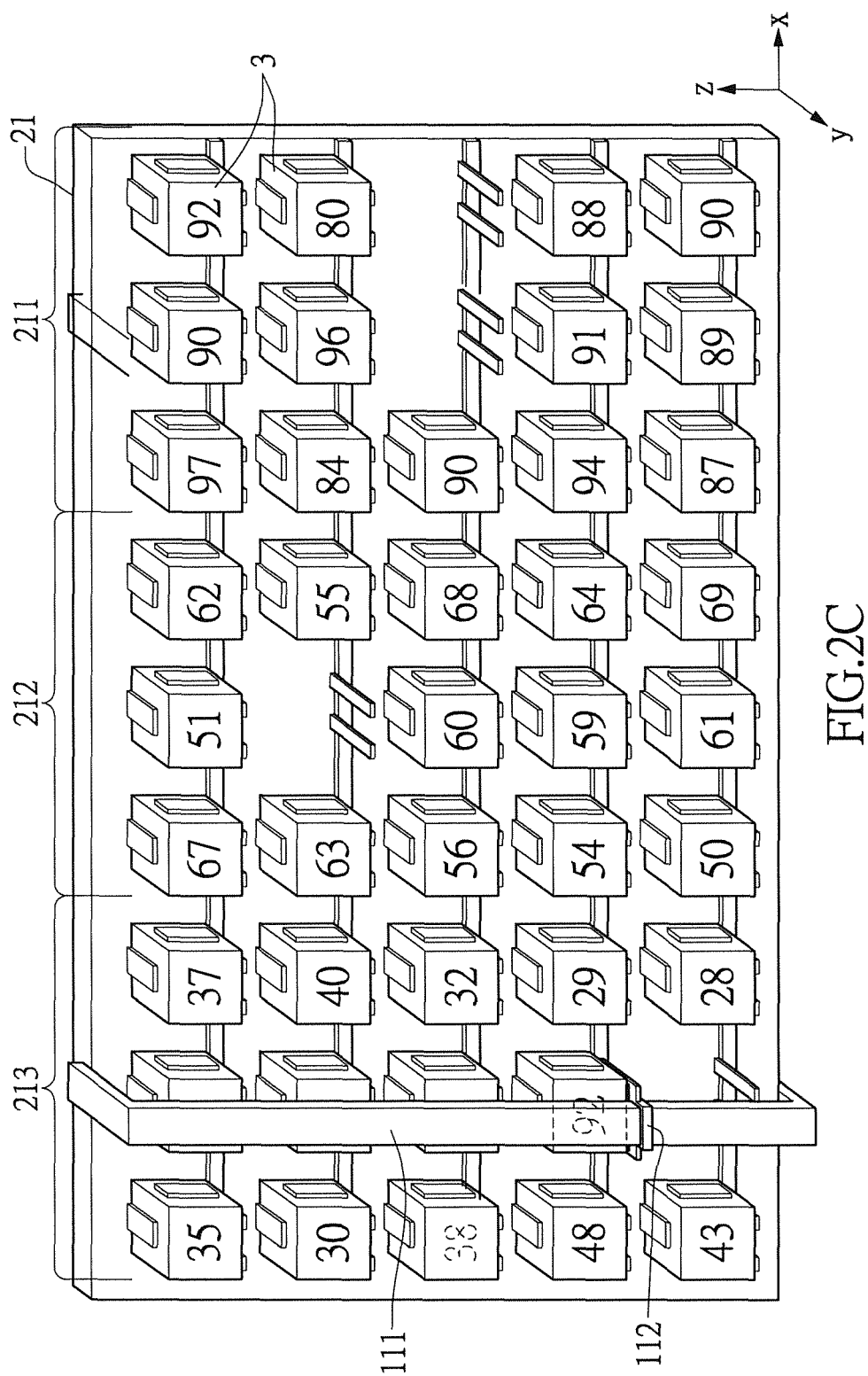
Figures 2, 3:
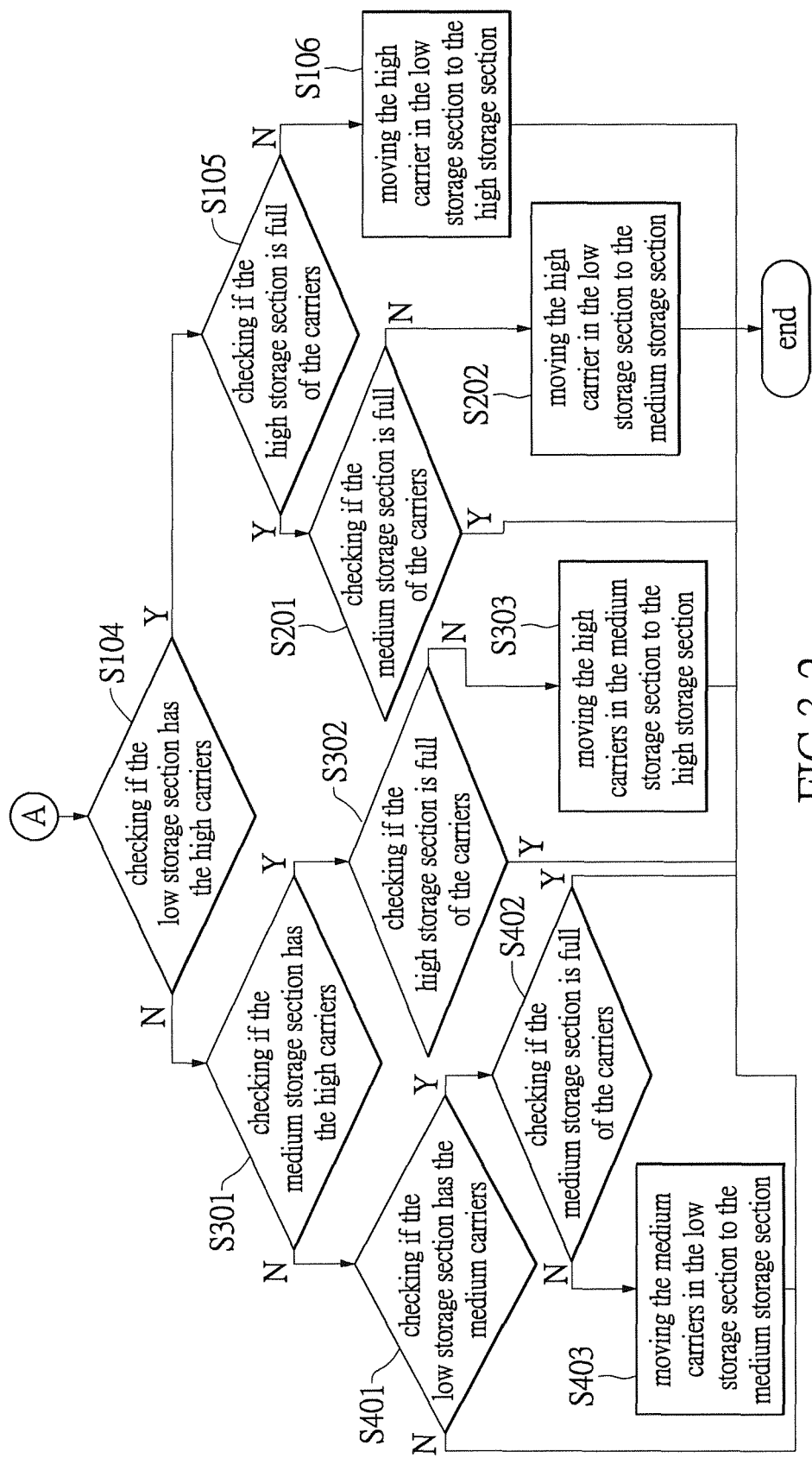

Please refer concurrently to FIG. 2C and step S104 in FIG. 3-2, then, the object carrier transport system 1 checks if the low storage section 213 has the high carriers 3.

Please refer to step S105 in FIG. 3-2, then, the object carrier transport system 1 checks if the high storage section 211 is full of the carriers 3 if the object carrier transport system 1 confirms that the low storage section 213 has the high carriers 3 (such as the carrier 3 referenced by number 92 in FIG. 2C).

Figure 2D:
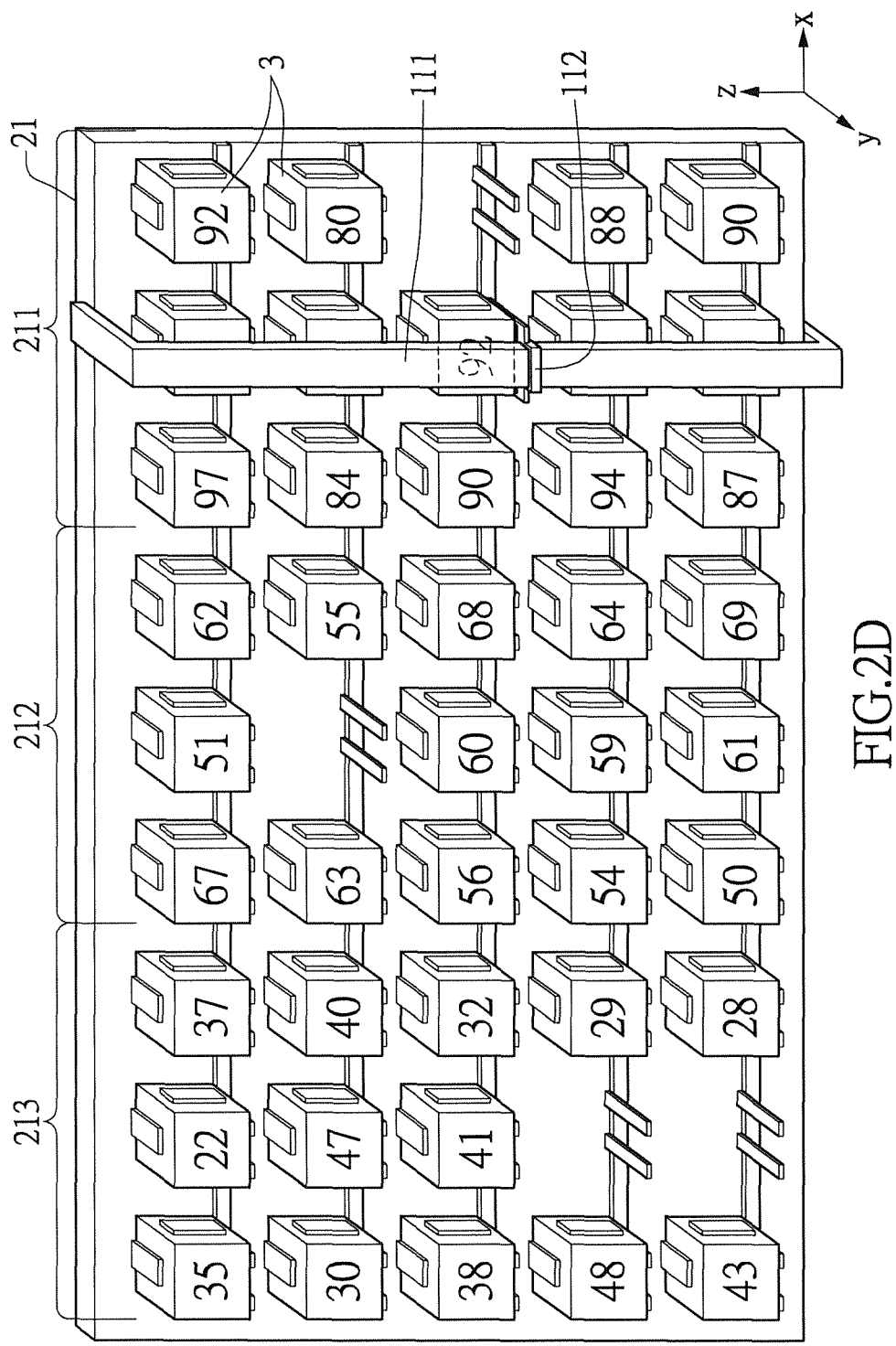

Please refer concurrently to FIGS. 2C to 2D and step S106 in FIG. 3-2, then, the object carrier transport system 1 moves the high carrier 3 in the low storage section 213 to the high storage section 211 if the object carrier transport system 1 confirms that the high storage section 211 is not full of the carriers 3.

Note that, no matter whether the carrier storage apparatus 2 enters the idle status or not, the processing unit 13 of the object carrier transport system 1 regularly updates the relative priorities of the carriers 3 in the storage sections 211, 212, and 213. Moreover, the control unit 12 of the object carrier transport system 1 controls the handling unit 11 to arrange the carriers 3 in the storage unit 21 according to the updated relative priorities of the carriers 3.

To sum up, when the carrier storage apparatus 2 is in the idle status, the object carrier transport system 1 can arrange the carriers 3 in the storage unit 21, such as to move the low carrier 3 in the high storage section 211 to the low storage section 213, and to move the high carrier 3 in the low storage section 213 to the high storage section 211.

The following describes the object carrier transport system 1 and the method of transporting object carriers in accordance with other embodiments of the present disclosure. In light of the above embodiment, it can be seen that the relationship between the components of the object carrier transport system 1 and the relationship between the steps of the method of transporting object carriers can be modified according to need. It's worth noting that, other features not mentioned in the following embodiments can be the same as that of the above embodiment.

The Second Embodiment of the Instant Disclosure

Please refer to step S201 in FIG. 3-2, wherein the step S201 is following the step S105. The object carrier transport system 1 checks if the medium storage section 212 is full of the carriers 3 if the object carrier transport system 1 confirms that the high storage section 211 is full of the carriers 3.

Please refer to step S202 in FIG. 3-2, next, the object carrier transport system 1 moves the high carrier 3 in the low storage section 213 to the medium storage section 212 if the object carrier transport system 1 confirms that the medium storage section 212 is not full of the carriers 3. On the other hand, the object carrier transport system 1 temporarily terminates the step of moving the carriers 3 in the storage unit 21 if the object carrier transport system 1 confirms that the medium storage section 212 is full of the carriers 3.

The Third Embodiment of the Instant Disclosure

Please refer to step S301 in FIG. 3-2, wherein the step S301 is following the step S104. The object carrier transport system 1 checks if the medium storage section 212 has the high carriers 3 if the object carrier transport system 1 confirms that the low storage section 213 does not have the high carriers 3.

Please refer to step S302 in FIG. 3-2, then, the object carrier transport system 1 checks if the high storage section 211 is full of the carriers 3 if the object carrier transport system 1 confirms that the medium storage section 211 has the high carriers 3.

Please refer to step S303 in FIG. 3-2, then, the object carrier transport system 1 moves the high carriers 3 in the medium storage section 212 to the high storage section 211 if the object carrier transport system 1 confirms that the high storage section 211 is not full of the carriers 3. On the other hand, the object carrier transport system 1 temporarily terminates the step of moving the carriers 3 in the storage unit 21 if the object carrier transport system 1 confirms that the high storage section 211 is full of the carriers 3.

The Fourth Embodiment of the Instant Disclosure

Please refer to step S401 in FIG. 3-2, wherein the step S401 is following the step S301. The object carrier transport system 1 checks if the low storage section 213 has the medium carriers 3 if the object carrier transport system 1 confirms that the medium storage section 212 does not have the high carriers 3.

Next, please refer to step S402 in FIG. 3-2, the object carrier transport system 1 checks if the medium storage section 212 is full of the carriers 3 if the object carrier transport system 1 confirms that the low storage section 213 has the medium carriers 3.

Please refer to step S403 in FIG. 3-2, then, the object carrier transport system 1 moves the medium carriers 3 in the low storage section 213 to the medium storage section 212 if the object carrier transport system 1 confirms that the medium storage section 212 is not full of the carriers 3. On the other hand, the object carrier transport system 1 temporarily terminates the step of moving the carriers 3 in the storage unit 21 if the object carrier transport system 1 confirms that the medium storage section 212 is full of the carriers 3, or that the low storage section 213 does not have the medium carriers 3.

The Fifth Embodiment of the Instant Disclosure

Please refer to step S501 in FIG. 3-1, wherein the step S501 is following the step S102. The object carrier transport system 1 the object carrier transport system 1 checks if the medium storage section 212 is full of the carriers 3 if the object carrier transport system 1 confirms that the low storage section 213 is full of the carriers 3.

Next, please refer to step S502 in FIG. 3-1, the object carrier transport system 1 moves the low carriers 3 in the high storage section 211 to the medium storage section 212 if the object carrier transport system 1 confirms that the medium storage section 212 is not full of the carriers 3. Subsequently, the object carrier transport system 1 executes the step S104 in FIG. 3-2. On the other hand, the object carrier transport system 1 directly executes the step S104 in FIG. 3-2 if the object carrier transport system 1 confirms that the medium storage section 212 is full of the carriers 3.

The Sixth Embodiment of the Instant Disclosure

Please refer to step S601 in FIG. 3-1, wherein the step S601 is following the step S101. The object carrier transport system 1 checks if the high storage section 211 has the medium carriers 3 if the object carrier transport system 1 confirms that the high storage section 211 does not have the low carriers 3.

Next, please refer to step S602 in FIG. 3-1, the object carrier transport system 1 checks if the medium storage section 212 is full of the carriers 3 if the object carrier transport system 1 confirms that the high storage section 211 has the medium carriers 3.

Please refer to step S603 in FIG. 3-1, then, the object carrier transport system 1 moves the medium carriers 3 in the high storage section 211 to the medium storage section 212 if the object carrier transport system 1 confirms that the medium storage section 212 is not full of the carriers 3. Subsequently, the object carrier transport system 1 executes the step S104 in FIG. 3-2. On the other hand, the object carrier transport system 1 directly executes the step S104 in FIG. 3-2 if the object carrier transport system 1 confirms that the medium storage section 212 is full of the carriers 3.

The Seventh Embodiment of the Instant Disclosure

Please refer to step S701 in FIG. 3-1, wherein the step S701 is following the step S601. The object carrier transport system 1 checks if the medium storage section 212 has the low carriers 3 if the object carrier transport system 1 confirms that the high storage section 211 does not have the medium carriers 3.

Next, please refer to step S702 in FIG. 3-1, the object carrier transport system 1 checks if the low storage section 213 is full of the carriers 3 if the object carrier transport system 1 confirms that the medium storage section 212 has the low carriers 3.

Please refer to step S703 in FIG. 3-1, then, the object carrier transport system 1 moves the low carriers 3 in the medium storage section 212 to the low storage section 213 if the object carrier transport system 1 confirms that the low storage section 213 is not full of the carriers 3. Subsequently, the object carrier transport system 1 executes the step S104 in FIG. 3-2. On the other hand, the object carrier transport system 1 directly executes the step S104 in FIG. 3-2 if the object carrier transport system 1 confirms that the medium storage section 212 does not have the low carrier 3, or that the low storage section 213 is full of the carriers 3.

The Eighth Embodiment of the Instant Disclosure

Figure 4:
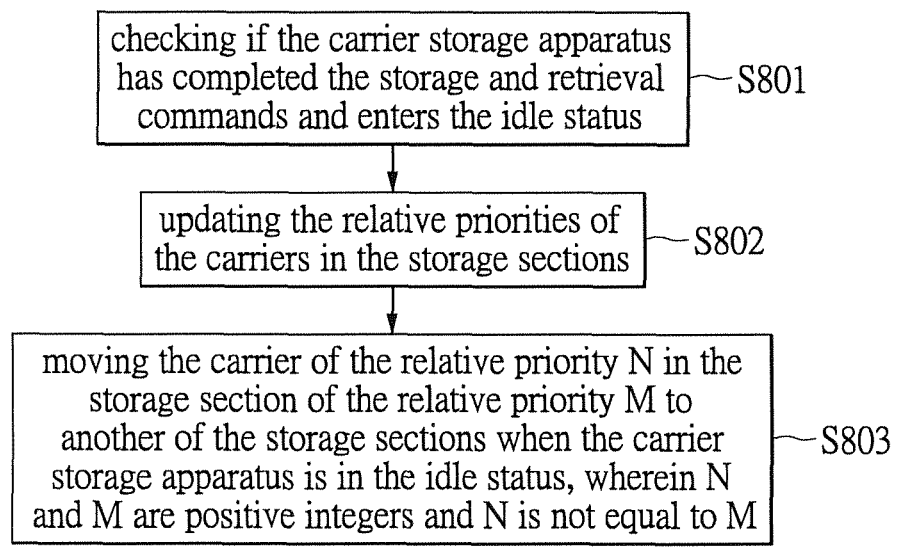
FIG. 4 illustrates a flowchart of the method of transporting object carriers in accordance with another embodiment the instant disclosure.

Please refer to FIG. 4. FIG. 4 illustrates a flowchart of the method of transporting object carriers in accordance with another embodiment the instant disclosure. The method of transporting object carriers is adapted to a carrier storage apparatus configured to execute storage and retrieval commands for carrying carriers in a plurality of storage sections, wherein the carriers each have a relative priority denoted by a first positive integer, and the storage sections each have a relative priority denoted by a second positive integer. The method of transporting object carriers comprises the following steps: first, checking if the carrier storage apparatus has completed the storage and retrieval commands and enters the idle status (step S801); updating the relative priorities of the carriers in the storage sections (step S802); and moving the carrier of the relative priority N in the storage section of the relative priority M to another of the storage sections when the carrier storage apparatus is in the idle status, wherein N and M are positive integers and N is not equal to M (step S803).

According to the above embodiments, through the method of transporting object carriers and the object carrier transport system 1, the carriers 3 in the storage unit 21 can be arranged according to the relative priorities of the carriers 3 and the relative priorities of the storage sections 211, 212, and 213 when the carrier storage apparatus 2 is in the idle status. Specifically, the carrier 3 of the highest relative priority which is stored in the storage section of the lowest relative priority (such as the low storage section 213) or in the storage section of the second lowest relative priority (such as the medium storage section 212) can be moved to the storage section of the highest relative priority (such as the high storage section 211). Thereby, the distance between the carrier 3 of the highest relative priority and the exit port 23 of the storage unit 21 can be shortened. Hence, the carriers 3 in the storage unit 21 can be transported to the exit port 23 more efficiently. In another embodiment, the carrier 3 of the highest relative priority which is stored in the storage section of the lowest relative priority (such as the low storage section 213) can be moved to the storage section of the second highest relative priority (such as the medium storage section 212), which is closer to the exit port 23.

While the invention has been disclosed with respect to a limited number of embodiments, numerous modifications and variations will be appreciated by those skilled in the art. It is intended, therefore, that the following claims cover all such modifications and variations that may fall within the true sprit and scope of the invention.

What is claimed is:

1. An object carrier transport system for a carrier storage apparatus for carrying carriers in a plurality of storage sections, the carriers each having a relative priority denoted by a first positive integer, the storage sections each having a relative priority denoted by a second positive integer, the carrier arrangement system comprising:
   a handling unit, wherein the carriers being moved by the handling unit;
   a control unit coupled to the handling unit, wherein the handling unit being controlled to move the carriers stored in the storage sections by the control unit when there is no carrier being input and output; and a processing unit coupled to the control unit, wherein the relative priorities of the carriers being regularly updated by the processing unit;

wherein the handling unit being controlled to move the carriers of the relative priority N in the storage section of the relative priority M to the storage section of the relative priority N by the control unit, wherein N and M are positive integer and M minus N is larger than 1, the handling unit selects to move the carrier of the relative priority (N+1) in the storage section of the relative priority M when the storage section of the relative priority M does not have the carrier of the relative priority N, and the handling unit selects to move the carrier of the relative priority N in the storage section of the relative priority (M−1) when the storage section of the relative priority M does not have the carrier the relative priority (N+1).

2. The object carrier transport system of claim 1, wherein the handling unit selects to move the carriers in the storage section of the highest relative priority prior to the carriers in others of the storage sections, and the handling unit selects to move the carrier of the lowest relative priority prior to others of the carriers; when the storage section of the lowest relative priority is full of the carriers, the handling unit selects to move the carrier of the lowest relative priority in the storage section of the highest relative priority to the storage section of the second lowest relative priority.

3. The object carrier transport system of claim 1, wherein the handling unit selects to move the carrier of the highest relative priority prior to others of the carriers, and the handling unit selects to move the carriers in the storage section of the lowest relative priority prior to the carriers in others of the storage sections; when the storage section of the highest relative priority is full of the carriers, the handling unit selects to move the carrier of the highest relative priority in the storage section of the lowest relative priority to the storage section of the second highest relative priority.

4. A method of transporting object carriers, for a carrier storage apparatus configured to execute storage and retrieval commands for carrying carriers in a plurality of storage sections, the carriers each having a relative priority denoted by a first positive integer, the storage sections each having a relative priority denoted by a second positive integer, the method of arranging carriers comprising steps of:

checking if the carrier storage apparatus has completed the storage and retrieval commands and enters an idle status;

updating the relative priorities of the carriers in the storage sections; and moving the carrier of the relative priority N in the storage section of the relative priority M to the storage section of the relative priority N there is no carrier being input and output, wherein N and M are positive integers and M minus N is larger than 1;

wherein the step of moving the carrier of the relative priority N in the storage section of the relative priority M comprises the steps of:

checking if the storage section of the relative priority M has the carrier of the relative priority N;

checking if the storage section of the relative priority N is full of the carriers;

moving the carrier of the relative priority N in the storage section of the relative priority M to the storage section of the relative priority N if the relative priority M has the carrier of the relative priority N and the storage section of the relative priority N is not full of the carriers;

wherein when the storage section of the relative priority M does not have the carrier of the relative priority N, wherein the step of moving the carrier of the relative priority N in the storage section of the relative priority M further comprises the steps of:

checking if the storage section of the relative priority M has the carrier of the relative priority (N+1);

checking if the storage section of the relative priority (M−1) has the carrier of the relative priority N when the storage section of the relative priority M does not have the carrier of the relative priority (N+1);

moving the carrier of the relative priority N in the storage section of the relative priority (M−1) to the storage section of the relative priority N, if the relative priority (M−1) has the carrier of the relative priority N and the storage section of the relative priority N is not full of the carriers.

5. The method of transporting object carriers of claim 4, wherein the step of checking if the storage section of the relative priority M has the carrier of the relative priority N comprises the steps of:

selecting to check the storage section of the highest relative priority prior to others of the storage sections and selecting to check if the storage section of the relative priority M has the carrier of the lowest relative priority prior to others of the carriers;

checking if the storage section of the second lowest relative priority is full of carriers when the storage section of the lowest relative priority is full of carriers; and moving the carrier of the lowest relative priority in the storage section of the highest relative priority to the storage section of the second lowest relative priority if the storage section of the second lowest relative priority is not full of carriers.

6. An object carrier transport system for a carrier storage apparatus for carrying carriers in a plurality of storage sections, the carriers each having a relative priority denoted by a first positive integer, the storage sections each having a relative priority denoted by a second positive integer, the carrier arrangement system comprising:

a handling unit, wherein the carriers being moved by the handling unit;

a control unit coupled to the handling unit, wherein the handling unit being controlled to move the carriers stored in the storage sections by the control unit when there is no carrier being input and output; and a processing unit coupled to the control unit, wherein the relative priorities of the carriers being regularly updated by the processing unit;

wherein the handling unit being controlled to move the carriers of the relative priority N in the storage section of the relative priority M to the storage section of the relative priority N by the control unit, wherein N and M are positive integer and N minus M is larger than 1, the handling unit selects to move the carrier of the relative priority N in the storage section of the relative priority (M+1) when the storage section of the relative priority M does not have the carrier of the relative priority N, and the handling unit selects to move the carrier of the relative priority (N−1) in the storage section of the relative priority M when the storage section of the relative priority (M+1) does not have the carrier of the relative priority N.

\* \* \* \* \*